(12) United States Patent
Tran et al.

(10) Patent No.: US 11,380,698 B2
(45) Date of Patent: *Jul. 5, 2022

(54) VIRTUAL GROUND NON-VOLATILE MEMORY ARRAY

(71) Applicant: Silicon Storage Technology, Inc., San Jose, CA (US)

(72) Inventors: Hieu Van Tran, San Jose, CA (US); Hung Quoc Nguyen, Fremont, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/178,520

(22) Filed: Feb. 18, 2021

(65) Prior Publication Data

US 2021/0175240 A1 Jun. 10, 2021

Related U.S. Application Data

(60) Division of application No. 16/264,349, filed on Jan. 31, 2019, now abandoned, which is a continuation of
(Continued)

(51) Int. Cl.
*G11C 16/04* (2006.01)
*H01L 27/11526* (2017.01)
(Continued)

(52) U.S. Cl.
CPC .... *H01L 27/11526* (2013.01); *G11C 16/0408* (2013.01); *G11C 16/14* (2013.01);
(Continued)

(58) Field of Classification Search
CPC ..... G11C 16/26; G11C 16/14; G11C 16/0491; G11C 16/045; G11C 16/0441;
(Continued)

(56) References Cited

U.S. PATENT DOCUMENTS 6,125,060 A 9/2000 Chang
6,646,914 B1 11/2003 Haddad
(Continued)

FOREIGN PATENT DOCUMENTS

CN 102 693 987 A 9/2012
JP H07-508859 A 9/1995
(Continued)

OTHER PUBLICATIONS

Extended European Search Report dated Feb. 8, 2022 for the related European Patent Application No. 21203195.9.
(Continued)

*Primary Examiner* — Alfredo Bermudez Lozada
(74) *Attorney, Agent, or Firm* — DLA Piper LLP (US)

(57) ABSTRACT

A memory device with memory cell pairs each having a single continuous channel region, first and second floating gates over first and second portions of the channel region, an erase gate over a third portion of the channel region between the first and second channel region portions, and first and second control gates over the first and second floating gates. For each of the pairs of memory cells, the first region is electrically connected to the second region of an adjacent pair of memory cells in the same active region, and the second region is electrically connected to the first region of an adjacent pair of the memory cells in the same active region.

5 Claims, 21 Drawing Sheets

Related U.S. Application Data application No. 14/935,201, filed on Nov. 6, 2015, now Pat. No. 10,312,248.

(60) Provisional application No. 62/078,873, filed on Nov. 12, 2014.

(51) Int. Cl.
*H01L 27/11519* (2017.01)
*H01L 27/11521* (2017.01)
*G11C 16/14* (2006.01)
*G11C 16/26* (2006.01)
*H01L 29/423* (2006.01)
*H01L 29/788* (2006.01)

(52) U.S. Cl.
CPC ........ *G11C 16/26* (2013.01); *H01L 27/11519* (2013.01); *H01L 27/11521* (2013.01); *H01L 29/42328* (2013.01); *H01L 29/7881* (2013.01)

(58) Field of Classification Search
CPC ............ G11C 16/0425; G11C 16/0483; G11C 16/0408; H01L 29/42328
See application file for complete search history.

(56) References Cited

U.S. PATENT DOCUMENTS

| | | | |
|---|---|---|---|
| 6,747,310 B2 * | 6/2004 | Fan | ............... H01L 27/11521 257/316 |
| 7,868,375 B2 | 1/2011 | Liu | |
| 2002/0109138 A1 | 8/2002 | Forbes | |
| 2003/0146465 A1 | 8/2003 | Wu | |
| 2005/0024961 A1 * | 2/2005 | Ding | ................ H01L 27/115 365/202 |
| 2006/0163642 A1 * | 7/2006 | Widdershoven | ... G11C 16/0458 257/315 |
| 2008/0049517 A1 | 2/2008 | Hung et al. | |
| 2008/0123416 A1 | 5/2008 | Chih | |
| 2009/0108328 A1 | 4/2009 | Widjaja | |
| 2010/0008141 A1 | 1/2010 | Chu | |
| 2012/0206969 A1 | 8/2012 | Gu | |
| 2014/0151782 A1 | 6/2014 | Tsair | |
| 2016/0217849 A1 | 7/2016 | Do | |

FOREIGN PATENT DOCUMENTS

| | | |
|---|---|---|
| JP | H08-83855 A | 3/1996 |
| JP | 2012 222201 | 11/2012 |
| JP | 2014 096421 | 5/2014 |
| TW | 2008 02816 | 1/2008 |
| WO | 2014 051855 | 4/2014 |

OTHER PUBLICATIONS

Partial European Search Report dated Feb. 8, 2022 for the related European Patent Application No. 21203184.3.

\* cited by examiner

FIG. 8

| | EG0 | EG1 | EGN | BL0 | BL1 | BL2 | BLN | CG0 A | CG0 B | CG1 A | CG1 B | CGN A | CGN B |
|---|---|---|---|---|---|---|---|---|---|---|---|---|---|
| ERASE | VEGE | 0V | 0V | 0V | 0V | 0V | 0V | 0V | 0V | 0V | 0V | 0V | 0V |
| PROGRAM | VEGP | 0V | 0V | VBLP | IPROG | 0V flt | 0V flt | VCGP | VCGP-pass | VCGP-inh | VCGP-inh | 0V | 0V |
| READ | VEGR | 0V | 0V | VBLR | 0V | 0V | 0V | VCGR | VCGR-pass | 0V | 0V | 0V | 0V |

ERASE:
VEGE  ~11.5-13V

PROGRAM:
VEGP       ~1-2V
VBLP       ~4.5V
IPROG      ~1-2uA
VCGP       ~10.5V
VCGP-pass  ~3-4V
VCGP-inh   ~4V

READ:
VEGR       ~2-4V
VBLR       ~0.5-2V

VCGR       ~2.5-4V
VCGR-pass  ~3-4V

FIG. 9

| | EG0 | EG1 | EGN | BL0 | BL1 | BL2 | BLN | CG0 A | CG0 B | CG1 A | CG1 B | CGN A | CGN B |
|---|---|---|---|---|---|---|---|---|---|---|---|---|---|
| ERASE | VEGE | 0V | 0V | 0V | 0V | 0V | 0V | VCGE | VCGE | VCGE | VCGE | VCGE | VCGE |
| PROGRAM | VEGP | 0V | 0V | VBLP | IPROG | 0V flt | 0V flt | VCGP | VCGP-pass | VCGP-inh | VCGP-inh | 0V | 0V |
| READ | VEGR | 0V | 0V | VBLR | 0V | 0V | 0V | VCGR | VCGR-pass | 0V | 0V | 0V | 0V |

ERASE:
VEGE  ~7-9V

VCGE  ~7 to -8V

PROGRAM:
VEGP       ~1-2V
VBLP       ~4.5V
IPROG      ~1-2uA
VCGP       ~10.5V
VCGP-pass  ~3-4V
VCGP-inh   ~4V

READ:
VEGR       ~2-4V
VBLR       ~0.5-2V

VCGR       ~2.5-4V
VCGR-pass  ~3-4V

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | 0V | 0V | 0V | 0V | 0V | 0V | 0V | 0V | 0V | 0V | 0V |
| PROGRAM | VEGP | 0V | 0V | ~VBLINH | VBLP | IPROG | 0V | ~VBLINH/ FLT~0V | VCGP | VCGP-pass | 0V | 0V | 0V | 0V |
| READ | VEGR | 0V | 0V | 0V | VBLR | 0V | 0V | 0V | VCGR | VCGR-pass | 0V | 0V | 0V | 0V |

ERASE:
VEGE   ~11.5-13V

PROGRAM:
VEGP        ~1-2V
VBLP        ~4.5V
IPROG       ~1-2uA
VCGP        ~10.5V
VCGP-pass   ~3-4V
VBLINH      ~2.5V

READ:
VEGR        ~2-4V
VBLR        ~0.5-2V

VCGR        ~2.5-4V
VCGR-pass   ~3-4V

FIG. 12

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | 0V | 0V | 0V | 0V | 0V | VCGE | VCGE | VCGE | VCGE | VCGE | VCGE |
| PROGRAM | VEGP | 0V | 0V | ~VBLINH | VBLP | IPROG | 0V | ~VBLINH/ FLT~0V | VCGP | VCGP-pass | 0V | 0V | 0V | 0V |
| READ | VEGR | 0V | 0V | 0V | VBLR | 0V | 0V | 0V | VCGR | VCGR-pass | 0V | 0V | 0V | 0V |

ERASE:
VEGE   ~7-9V

VCGE   ~7 to -8V

PROGRAM:
VEGP        ~1-2V
VBLP        ~4.5V
IPROG       ~1-2uA
VCGP        ~10.5V
VCGP-pass   ~3-4V
VBLINH      ~2.5V

READ:
VEGR        ~2-4V
VBLR        ~0.5-2V

VCGR        ~2.5-4V
VCGR-pass   ~3-4V

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | 0V | 0V | 0V | 0V | 0V | 0V | 0V | 0V | 0V | 0V | 0V |
| PROGRAM | VEGP | 0V | 0V | ~VBLINH | VBLP | IPROG | ~VBLINH/FLT~0V | ~VBLINH/FLT~0V | VCGP | VCGP-pass | 0V | 0V | 0V | 0V |
| READ | VEGR | 0V | 0V | 0V | VBLR | 0V | 0V | 0V | VCGR | VCGR-pass | 0V | 0V | 0V | 0V |

ERASE:
VEGE   ~11.5-13V

PROGRAM:
VEGP          ~1-2V
VBLP          ~4.5V
IPROG        ~1-2uA
VCGP         ~10.5V
VCGP-pass  ~3-4V
VBLINH      ~2.5V

READ:
VEGR         ~2-4V
VBLR         ~0.5-2V

VCGR         ~2.5-4V
VCGR-pass  ~3-4V

FIG. 18

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | 0V | 0V | 0V | 0V | 0V | VCGE | VCGE | VCGE | VCGE | VCGE | VCGE |
| PROGRAM | VEGP | 0V | 0V | ~VBLINH | VBLP | IPROG | ~VBLINH/FLT~0V | ~VBLINH/FLT~0V | VCGP | VCGP-pass | 0V | 0V | 0V | 0V |
| READ | VEGR | 0V | 0V | 0V | VBLR | 0V | 0V | 0V | VCGR | VCGR-pass | 0V | 0V | 0V | 0V |

ERASE:
VEGE   ~7-9V
VCGE   ~-7 to -8V

PROGRAM:
VEGP          ~1-2V
VBLP          ~4.5V
IPROG        ~1-2uA
VCGP         ~10.5V
VCGP-pass  ~3-4V
VBLINH      ~2.5V

READ:
VEGR         ~2-4V
VBLR         ~0.5-2V

VCGR         ~2.5-4V
VCGR-pass  ~3-4V

| | EG0 | EG1 | EGN | BL0 A | BL0 B | BL1 A | BL1 B | BLN A | BLN B | CG0 A | CG0 B | CG1 A | CG1 B | CGN A | CGN B |
|---|---|---|---|---|---|---|---|---|---|---|---|---|---|---|---|
| ERASE | VEGE | 0V | 0V | 0V | 0V | 0V | 0V | 0V | 0V | 0V | 0V | 0V | 0V | 0V | 0V |
| PROGRAM | VEGP | 0V | 0V | VBLP | IPROG | ~VBLINH | ~VBLINH | ~VBLINH | ~VBLINH | VCGP | VCGP-pass | 0V | 0V | 0V | 0V |
| READ | VEGR | 0V | 0V | VLBR | 0V | 0V | 0V | 0V | 0V | VCGR | VCGR-pass | 0V | 0V | 0V | 0V |

ERASE:
VEGE   ~11.5-13V

PROGRAM:
VEGP      ~1-2V
VBLP      ~4.5V
IPROG     ~1-2uA
VCGP      ~10.5V
VCGP-pass ~3-4V
VBLINH    ~2.5V

READ:
VEGR       ~2-4V
VBLR       ~0.5-2V

VCGR       ~2.5-4V
VCGR-pass  ~3-4V

FIG. 21

| | EG0 | EG1 | EGN | BL0 A | BL0 B | BL1 A | BL1 B | BLN A | BLN B | CG0 A | CG0 B | CG1 A | CG1 B | CGN A | CGN B |
|---|---|---|---|---|---|---|---|---|---|---|---|---|---|---|---|
| ERASE | VEGE | 0V | 0V | 0V | 0V | 0V | 0V | 0V | 0V | VCGE | VCGE | VCGE | VCGE | VCGE | VCGE |
| PROGRAM | VEGP | 0V | 0V | VBLP | IPROG | ~VBLINH | ~VBLINH | ~VBLINH | ~VBLINH | VCGP | VCGP-pass | 0V | 0V | 0V | 0V |
| READ | VEGR | 0V | 0V | VBLR | 0V | 0V | 0V | 0V | 0V | VCGR | VCGR-pass | 0V | 0V | 0V | 0V |

ERASE:
VEGE   ~7-9V
VCGE   ~7 to -8V

PROGRAM:
VEGP      ~1-2V
VBLP      ~4.5V
IPROG     ~1-2uA
VCGP      ~10.5V
VCGP-pass ~3-4V
VBLINH    ~2.5V

READ:
VEGR       ~2-4V
VBLR       ~0.5-2V

VCGR       ~2.5-4V
VCGR-pass  ~3-4V

FIG. 22

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | 0V | 0V | 0V | 0V | 0V | 0V | 0V | 0V | 0V | 0V | 0V |
| PROGRAM | VEGP | 0V | 0V | FLT~0V/~VBLINH | IPROG | VBLP | ~VBLINH/FLT~0V | ~VBLINH/FLT~0V | VCGP | VCGP-pass | 0V | 0V | 0V | 0V |
| READ | VEGR | 0V | 0V | 0V | 0V/VBLR | VBLR/0V | 0V | 0V | VCGR | VCGR-pass | 0V | 0V | 0V | 0V |

ERASE:
VEGE   ~11.5-13V

PROGRAM:
VEGP   ~1-2V
VBLP   ~4.5V
IPROG   ~1-2uA
VCGP   ~10.5V
VCGP-pass   ~3-4V
VBLINH   ~2.5V

READ:
VEGR   ~2-4V
VBLR   ~0.5-2V
VCGR   ~2.5-4V
VCGR-pass   ~3-4V

FIG. 26

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | 0V | 0V | 0V | 0V | 0V | VCGE | VCGE | VCGE | VCGE | VCGE | VCGE |
| PROGRAM | VEGP | 0V | 0V | FLT~0V/~VBLINH | IPROG | VBLP | ~VBLINH/FLT~0V | ~VBLINH/FLT~0V | VCGP | VCGP-pass | 0V | 0V | 0V | 0V |
| READ | VEGR | 0V | 0V | 0V | 0V/VBLR | VBLR/0V | 0V | 0V | VCGR | VCGR-pass | 0V | 0V | 0V | 0V |

ERASE:
VEGE   ~7-9V
VCGE   ~7 to -8V

PROGRAM:
VEGP   ~1-2V
VBLP   ~4.5V
IPROG   ~1-2uA
VCGP   ~10.5V
VCGP-pass   ~3-4V
VBLINH   ~2.5V

READ:
VEGR   ~2-4V
VBLR   ~0.5-2V
VCGR   ~2.5-4V
VCGR-pass   ~3-4V

FIG. 27

| | EG0 | EG1 | EGN | WL0 | WL1 | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|---|---|
| ERASE | VEGE | 0V | 0V | 0V | 0V | 0V | 0V | 0V | 0V | 0V | 0V | 0V | 0V | 0V | 0V | 0V |
| PROGRAM | VEGP | 0V | 0V | VWLP | 0V | FLT~0V/ ~VBLINH | IPROG | VBLP | ~VBLINH/ FLT~0V | ~VBLINH/ FLT~0V | VCGP | VCGP-pass | VCGINH/ 0V | VCGINH/ 0V | VCGINH/ 0V | VCGINH/ 0V |
| READ | VEGR | 0V | 0V | WVLR | 0V | 0V | 0V/ VBLR | VBLR/ 0V | 0V | 0V | VCGR | VCGR-pass | 0V | 0V | 0V | 0V |

ERASE:

VEGE    ~11.5-13V

PROGRAM:

VWLP    ~1-2V
VEGP    ~3.8V
VBLP    ~4.5V
IPROG    ~1-2uA
VCGP    ~10.5V

VCGP-pass    ~3-4V
VBLINH    ~2.5V
VCGINH    ~3-6V

READ:

VWLR    ~1-4V
VEGR    ~2-4V
VBLR    ~0.5-2V

VCGR    ~2.5-4V
VCGR-pass    ~3-4V

FIG. 30

| | EG0 | EG1 | EGN | WL0 | WL1 | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|---|---|
| ERASE | VEGE | 0V | 0V | 0V | 0V | 0V | 0V | 0V | 0V | 0V | VCGE | VCGE | VCGE | VCGE | VCGE | VCGE |
| PROGRAM | VEGP | 0V | 0V | VWLP | 0V | FLT~0V/ ~VBLINH | IPROG | VBLP | ~VBLINH/ FLT~0V | ~VBLINH/ FLT~0V | VCGP | VCGP-pass | VCGINH/ 0V | VCGINH/ 0V | VCGINH/ 0V | VCGINH/ 0V |
| READ | VEGR | 0V | 0V | WVLR | 0V | 0V | 0V/ VBLR | VBLR/ 0V | 0V | 0V | VCGR | VCGR-pass | 0V | 0V | 0V | 0V |

ERASE:

VEGE ~11.5-13V

VCGE ~7 to -8V

PROGRAM:

VWLP ~1-2V
VEGP ~3.8V
VBLP ~4.5V
IPROG ~1-2uA
VCGP ~10.5V

VCGP-pass ~3-4V
VBLINH ~2.5V
VCGINH ~3-6V

READ:

VWLR ~1-4V
VEGR ~2-4V
VBLR ~0.5-2V

VCGR ~2.5-4V
VCGR-pass ~3-4V

FIG. 31

VIRTUAL GROUND NON-VOLATILE MEMORY ARRAY

RELATED APPLICATIONS

This application is a divisional of U.S. application Ser. No. 16/264,349 filed on Jan. 31, 2019, which is a continuation of U.S. application Ser. No. 14/935,201, filed on Nov. 6, 2015 and issued as U.S. Pat. No. 10,312,248 on Jun. 4, 2019, which claims the benefit of U.S. Provisional Application No. 62/078,873, filed Nov. 12, 2014, and which are incorporated herein by reference.

FIELD OF THE INVENTION

The present invention relates to non-volatile memory arrays.

BACKGROUND OF THE INVENTION

Split gate non-volatile flash memory cells are well known. For example, U.S. Pat. No. 6,747,310 discloses such memory cells having source and drain regions defining a channel region there between, a select gate over one portion of the channel regions, a floating gate over the other portion of the channel region, and an erase gate over the source region. The memory cells are formed in pairs that share a common source region and common erase gate, with each memory cell having its own channel region in the substrate extending between the source and drain regions (i.e. there are two separate channel regions for each pair of memory cells). The lines connecting all the control gates for memory cells in a given column run vertically. The same is true for the lines connecting the erase gates and the select gates, and the source lines. The bit lines connecting drain regions for each row of memory cells run horizontally.

Given the number of electrodes for each cell (source, drain, select gate, control gate and erase gate), and two separate channel regions for each pair of memory calls, configuring and forming the architecture and array layout with all the various lines connected to these electrodes can be overly complex and difficult to implement, especially as critical dimensions continue to shrink.

BRIEF SUMMARY OF THE INVENTION

The aforementioned problems and needs are addressed by a memory device that includes a substrate of semiconductor material of a first conductivity type, spaced apart isolation regions formed on the substrate which are substantially parallel to one another and have lengths that extend in a first direction, with an active region between each pair of adjacent isolation regions also having lengths extending in the first direction, where each of the active regions including a plurality of pairs of memory cells. Each of the memory cell pairs includes first and second regions spaced apart in the substrate and having a second conductivity type different than the first conductivity type, with a continuous channel region in the substrate extending entirely between the first and second regions, a first floating gate disposed vertically over and insulated from a first portion of the channel region adjacent to the first region, a second floating gate disposed vertically over and insulated from a second portion of the channel region adjacent to the second region, an erase gate disposed vertically over and insulated from a third portion of the channel region between the first and second channel region portions, a first control gate disposed vertically over and insulated from the first floating gate, and a second control gate disposed vertically over and insulated from the second floating gate. The pairs of memory cells are configured in an array such that for each of the pairs of memory cells, the channel region extends entirely from the first region to the second region in the first direction, the first region is electrically connected to the second region of an adjacent pair of memory cells in the same active region, and the second region is electrically connected to the first region of an adjacent pair of the memory cells in the same active region. A plurality of first control gate lines have lengths extending in a second direction orthogonal to the first direction and each electrically connected to one of the first control gates in each of the active regions. A plurality of second control gate lines have lengths extending in the second direction and each electrically connected to one of the second control gates in each of the active regions. A plurality of bit lines have lengths extending in the second direction and each electrically connected to one of the first regions and one of the second regions in each of the active regions. A plurality of erase gate lines having lengths extending in the first direction and each electrically connected to the erase gates in one of the active regions.

A memory device can include a substrate of semiconductor material of a first conductivity type, spaced apart isolation regions formed on the substrate which are substantially parallel to one another and extend in a first direction, with an active region between each pair of adjacent isolation regions also extending in the first direction, where each of the active regions including a plurality of pairs of memory cells. Each of the memory cell pairs includes first and second regions spaced apart in the substrate and having a second conductivity type different than the first conductivity type, with a continuous channel region in the substrate extending between the first and second regions, a first floating gate disposed over and insulated from a first portion of the channel region adjacent to the first region, a second floating gate disposed over and insulated from a second portion of the channel region adjacent to the second region, an word line gate disposed over and insulated from a third portion of the channel region between the first and second channel region portions, a first control gate disposed over and insulated from the first floating gate, a second control gate disposed over and insulated from the second floating gate, a first erase gate disposed over and insulated from the first region, and a second erase gate disposed over and insulated from the second region. The pairs of memory cells are configured in an array such that for each of the pairs of memory cells, the channel region extends from the first region to the second region in the first direction, the first region is electrically connected to the second region of an adjacent pair of memory cells in the same active region, and the second region is electrically connected to the first region of an adjacent pair of the memory cells in the same active region.

Other objects and features of the present invention will become apparent by a review of the specification, claims and appended figures.

BRIEF DESCRIPTION OF THE DRAWINGS

FIGS. 8 and 9 are tables of operating voltages for architecture #1.

FIGS. 12 and 13 are tables of operating voltages for architecture #2.

FIGS. 17 and 18 are tables of operating voltages for architecture #3.

FIGS. 21 and 22 are tables of operating voltages for architecture #4.

FIGS. 26 and 27 are tables of operating voltages for architecture #5.

FIGS. 30 and 31 are tables of operating voltages for architecture #6.

DETAILED DESCRIPTION OF THE INVENTION

Figure 1:
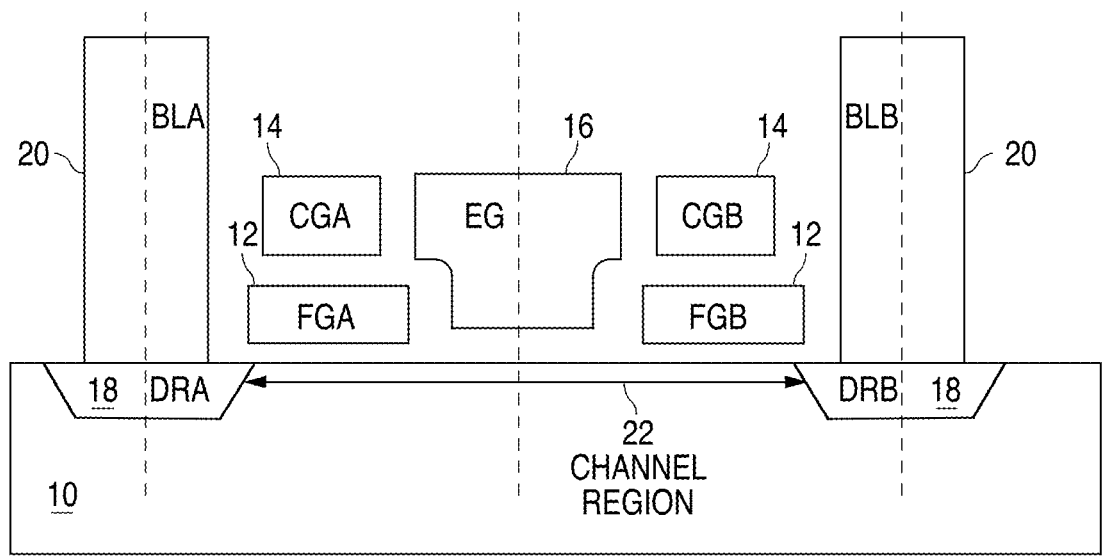
FIG. 1 is a side cross section view of a first memory cell design (CELL #1).

The present invention is a memory cell design, architecture and array layout that utilizes a virtual ground memory cell configuration. FIG. 1 illustrates a first memory cell design (CELL #1), where each memory cell includes a floating gate 12 (FG) disposed over and insulated from the substrate 10, a control gate 14 (CG) disposed over and insulated from the floating gate 12, an erase gate 16 (EG) disposed adjacent to and insulated from the floating and control gates 12/14 and disposed over and insulated from the substrate 10, where the erase gate is created with a T shape such that a top corner of the control gate CG faces the inside corner of the T shaped erase gate to improve erase efficiency, and a drain region 18 (DR) in the substrate adjacent the floating gate 12 (with a bit line contact 20 (BL) connected to the drain diffusion regions 18 (DR)). The memory cells are formed as pairs of memory cells (A on the left and B on the right), sharing a common erase gate 16. This cell design differs from that in the '310 patent discussed above at least in that it lacks a source region under the erase gate EG, lacks a select gate (also referred to as a word line), and lacks a channel region for each memory cell. Instead, a single continuous channel region 22 extends under both memory cells (i.e. extends from the drain region 18 of one memory cell to the drain region 18 of the other memory cell). To read or program one memory cell, the control gate 14 of the other memory cell is raised to a sufficient voltage to turn on the underlying channel region portion via voltage coupling to the floating gate 12 there between (e.g. to read or program cell A, the voltage on FGB is raised via voltage coupling from CGB to turn on the channel region portion under FGB).

Figure 2:
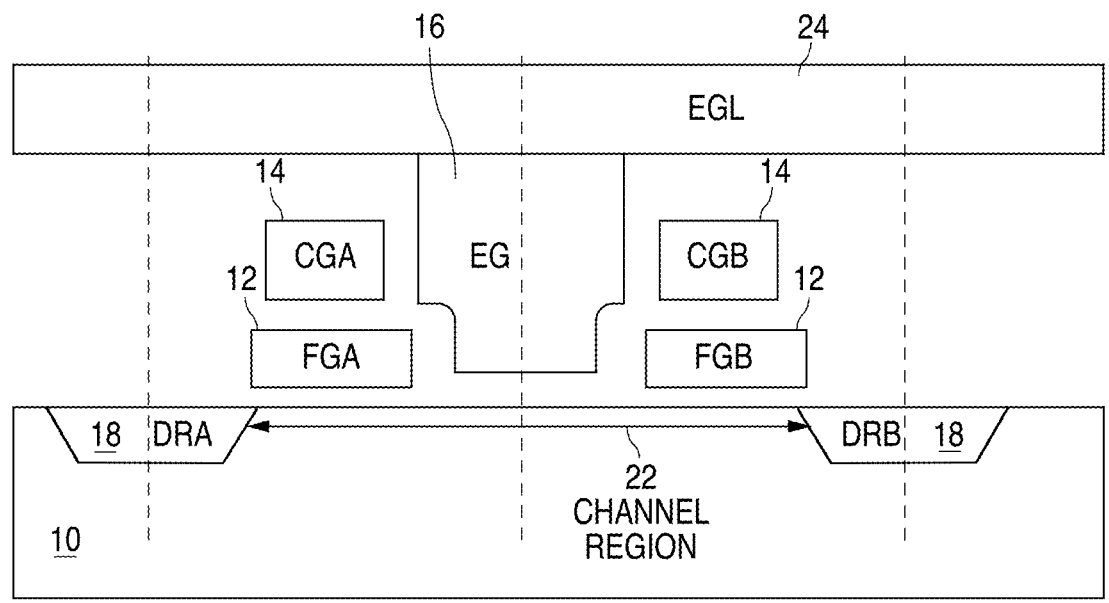
FIG. 2 is a side cross section view of a second memory cell design (CELL #2).

FIG. 2 illustrates a second memory cell design (CELL #2), which is the same as CELL #1 except there are no bit line contacts 20 in electrical contact with the drain regions 18 (DR), and instead there is an erase gate line 24 (EGL) that connects together all the erase gates 16 (EG) in the row of memory cells.

Figure 3:
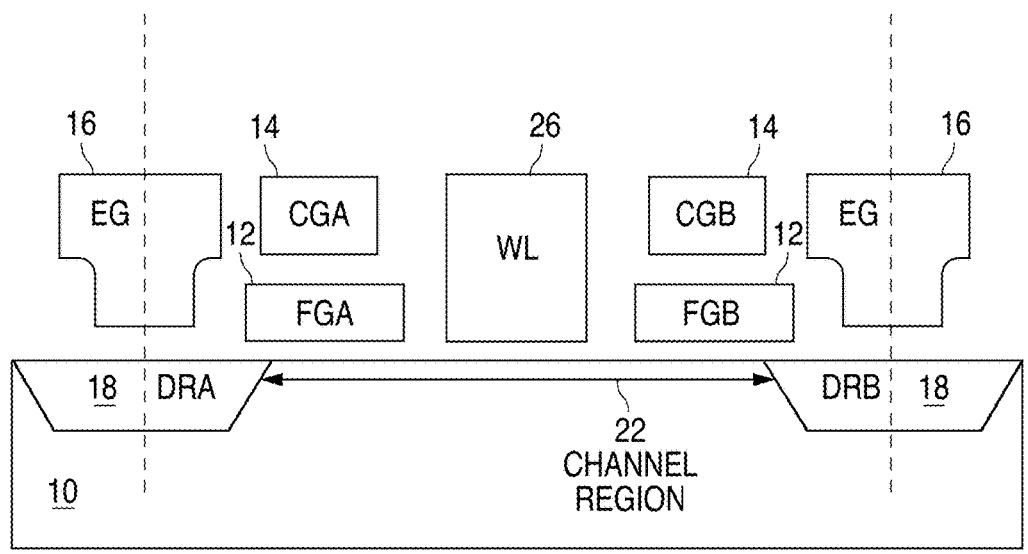
FIG. 3 is a side cross section view of a third memory cell design (CELL #3).

FIG. 3 illustrates a third memory cell design (CELL #3), where each memory cell includes a floating gate 12 (FG) disposed over and insulated from the substrate and a control gate 14 (CG) disposed over and insulated from the floating gate 12. To one side of the floating and control gates 12/14 is a word line (select) gate 26 (WL), and to the other side of the floating and control gates 12/14 is an erase gate 16 (EG). A drain region 18 (DR) is disposed in the substrate 10 underneath the erase gate 16 (EG). The memory cells are formed as pairs of memory cells sharing a common word line gate 26, and with a single continuous channel region 22 extending under both memory cells (i.e. extends from the drain region 18 of one memory cell to the drain region 18 of the other memory cell 18). As with Cells #1 and #2, to read or program one memory cell, the control gate 14 of the other memory cell is raised to a sufficient voltage to turn on the underlying channel region portion via voltage coupling to the floating gate 12 there between.

The present invention includes several memory cell array architectures and layouts of the various contacts and voltage lines to achieve the desired operation and performance of CELLS #1, #2 and #3.

Architecture #1

Figure 4:
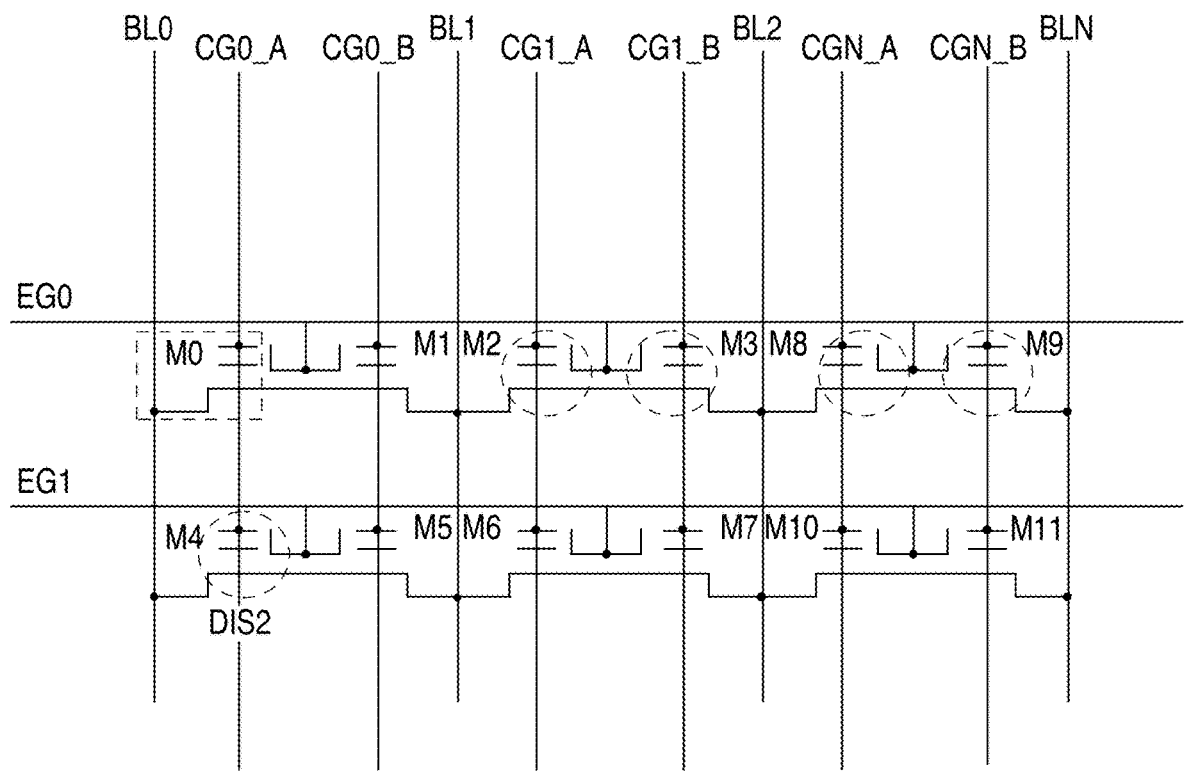
FIG. 4 is a schematic diagram of a first memory cell array architecture (architecture #1), applicable for Cell #2.
Figure 5:
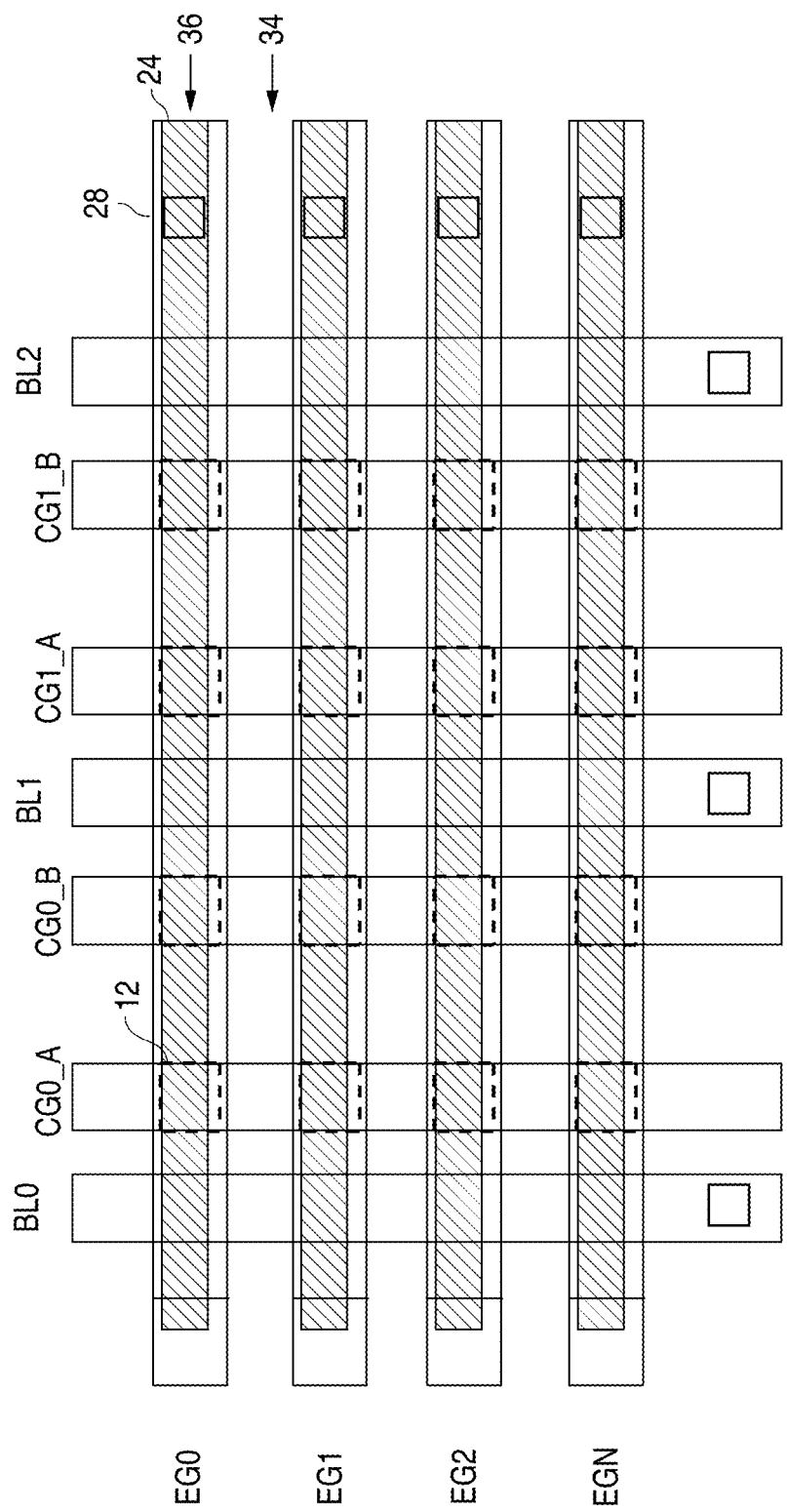
FIG. 5 is a plan view of the memory cell array layout for architecture #1.

FIG. 4 shows a first architecture (#1), and FIG. 5 shows the corresponding memory cell array layout, which are applicable to Cell #2. The memory cell pairs, and the active regions 36 in which they are formed, extend horizontally, and are interlaced between horizontally extending isolation regions 34 (e.g., STI insulation material formed in the substrate). The bit lines BL0, BL1, etc. are lines of conductive diffusion in the substrate 10 running along the columns of memory cells (i.e., for each column, the drain regions 18 and the diffusion extending there between in the column direction form a conductive bit line that electrically connecting the column of drain regions to each other). The erase gate lines EG0, EG1, etc. are preferably stripes of conductive polysilicon 24 each forming the erase gates 16 (EG) for that row of memory cells, and each strapped to (i.e., repeatedly connected to) a metal line 28 running over the polysilicon stripe (in the horizontal direction). The control gate lines CG0, CG1, etc. are preferably stripes of conductive polysilicon each forming the control gates 14 (CG) for that column of memory cells, and each can be strapped to a metal line running over the polysilicon stripe (in the vertical direction) (i.e., each control gate line can be the control gates 14 and the polysilicon connecting them, and/or a metal line strapped to the control gate polysilicon).

In this embodiment, the pairs of memory cells are configured in an array such that for each of the pairs of memory cells, the channel region extends from the first drain region DRA to the second drain region DRB in the same direction (horizontally to the right in FIG. 5). Additionally, in each active region, the pairs of memory cells are configured end to end such that the first region of one memory cell pair is contiguously formed with (electrically connected to) the second region of an adjacent memory cell pair in the same active region, and the second region of the one memory cell pair is continuously formed with (electrically connected to) the first region of the other adjacent memory cell pair in the same active region.

Figure 6:
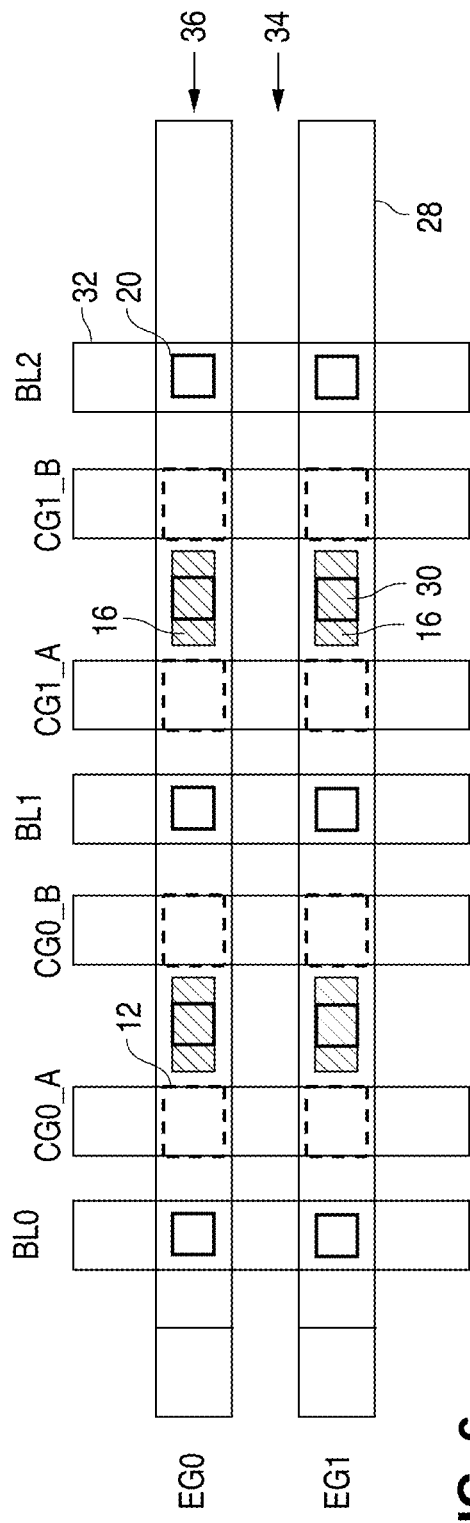
FIG. 6 is a plan view of a first alternate memory cell array layout for architecture #1.

FIG. 6 shows first alternate layout for the first architecture (#1), which is applicable for Cells #1 and #2. This layout is the same as in FIG. 5, except that the erase gates 16 (EG) are formed as individual poly blocks, and connected to a metal strap line 28 (extending in the horizontal direction) by vertical contacts 30. Additionally, metal bit lines 32 extending in the vertical direction connect to the drain diffusion via contacts 20 for each memory cell.

Figure 7:
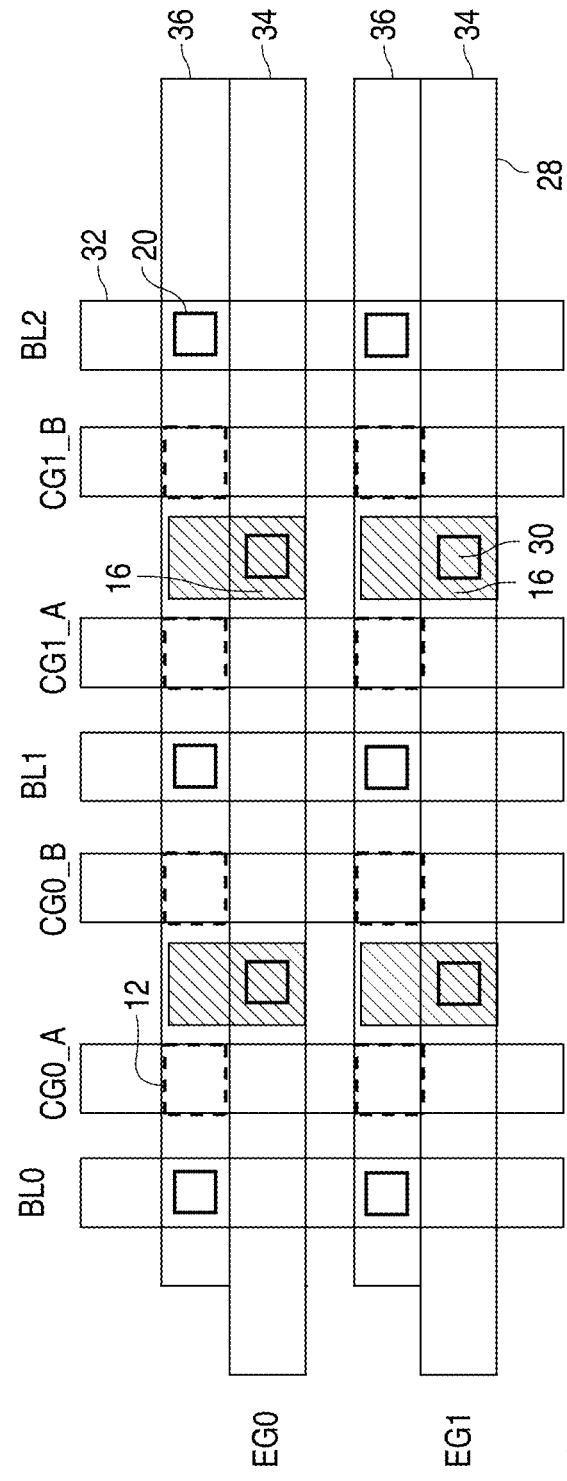
FIG. 7 is a plan view of a second alternate memory cell array layout for architecture #1.

FIG. 7 shows a second alternate layout for the first architecture (#1), which is applicable for Cells #1 and #2. This layout is the same as in FIG. 6, except that the erase gate blocks 16 extend from the active regions 36 into the STI isolation regions 34, and the metal EG lines 28 and the contacts therefrom 30 to the erase gate blocks 16 are disposed in the isolation region 34 (which better protects the oxide under the erase gates 16).

FIG. 8 includes a table of operating voltages (including non-limiting examples of actual voltages) for programming and reading a selected memory cell (in this case memory cell M0, which corresponds to EG0, BL0 and CG0_A) for architecture #1. The erase voltage (VEGE on the selected EG line) indicated in this figure will erase all the memory cells in the pair of rows containing the selected memory cell M0. FIG. 9 includes a second table of operating voltages which is the same as in FIG. 8, except a lower erase voltage VEGE is used, and a negative voltage VCGE is applied to the control gates during erase. In a read operation, selected BL, EG and CG lines of a selected memory cell pair (connecting to BL, EG, and CG of a selected memory cell within a selected memory cell pair) are biased at selected read bias voltages, the other CG line of the selected memory pair (connecting to other CG of unselected memory cell of selected memory cell pair) is biased at a pass read bias voltage, while other unselected CG lines are biased at 0 volts, and other BL lines are biased at 0 Volts. In a program operation, selected BL, EG and CG of the selected memory cell pair are biased at selected program bias voltages, the other BL of the selected memory cell pair is biased at a program current, the other CG line of selected memory cell pair is biased at a pass program bias voltage, and adjacent CG lines of next adjacent memory cell pairs abutting the selected memory cell pair are biased at an inhibit program bias, and other unselected CG lines are biased at 0 volts.

Architecture #2

Figure 10:
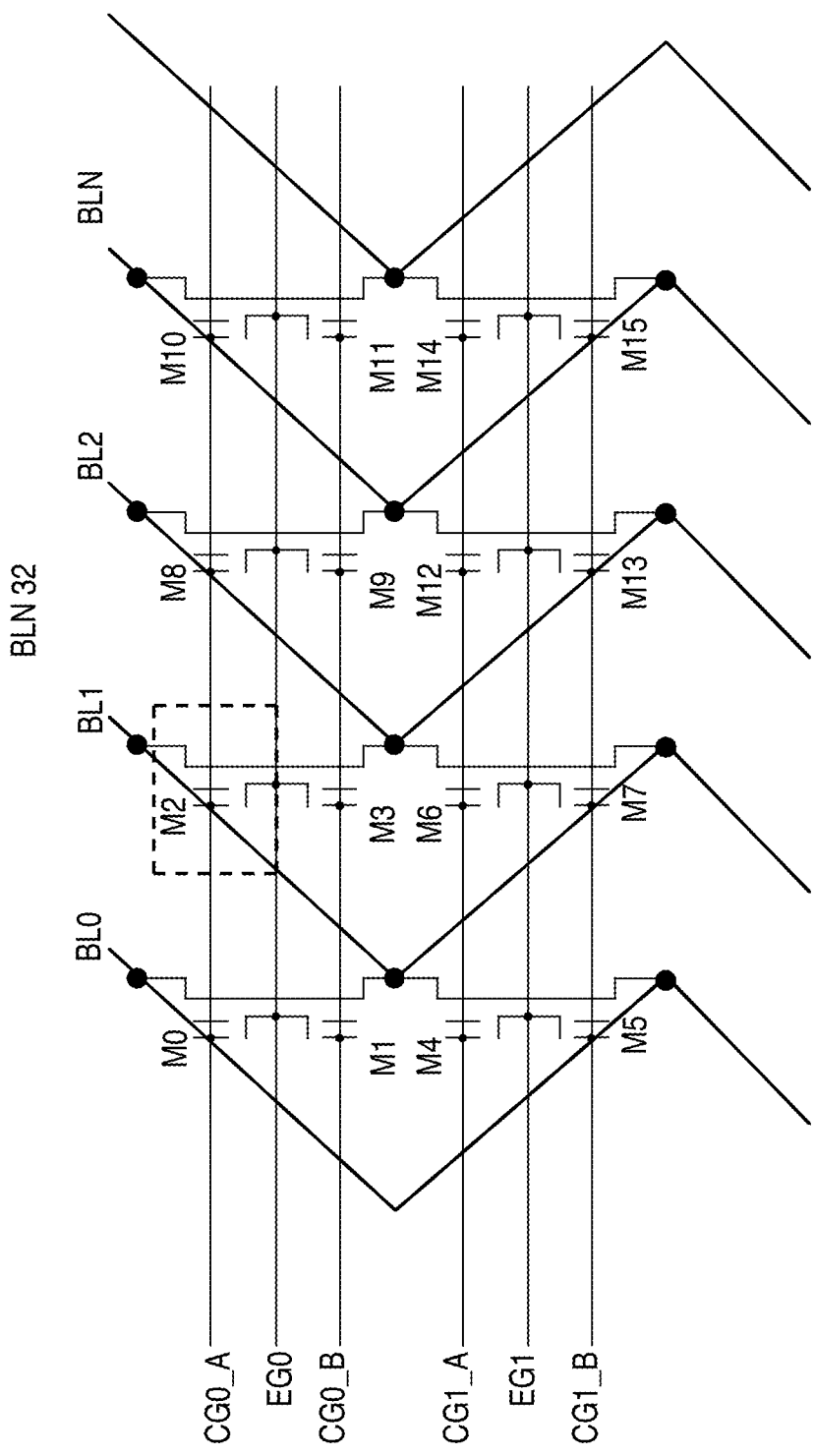
FIG. 10 is a schematic diagram of a second memory cell array architecture (architecture #2), applicable for Cells #1 and #2.
Figure 11:
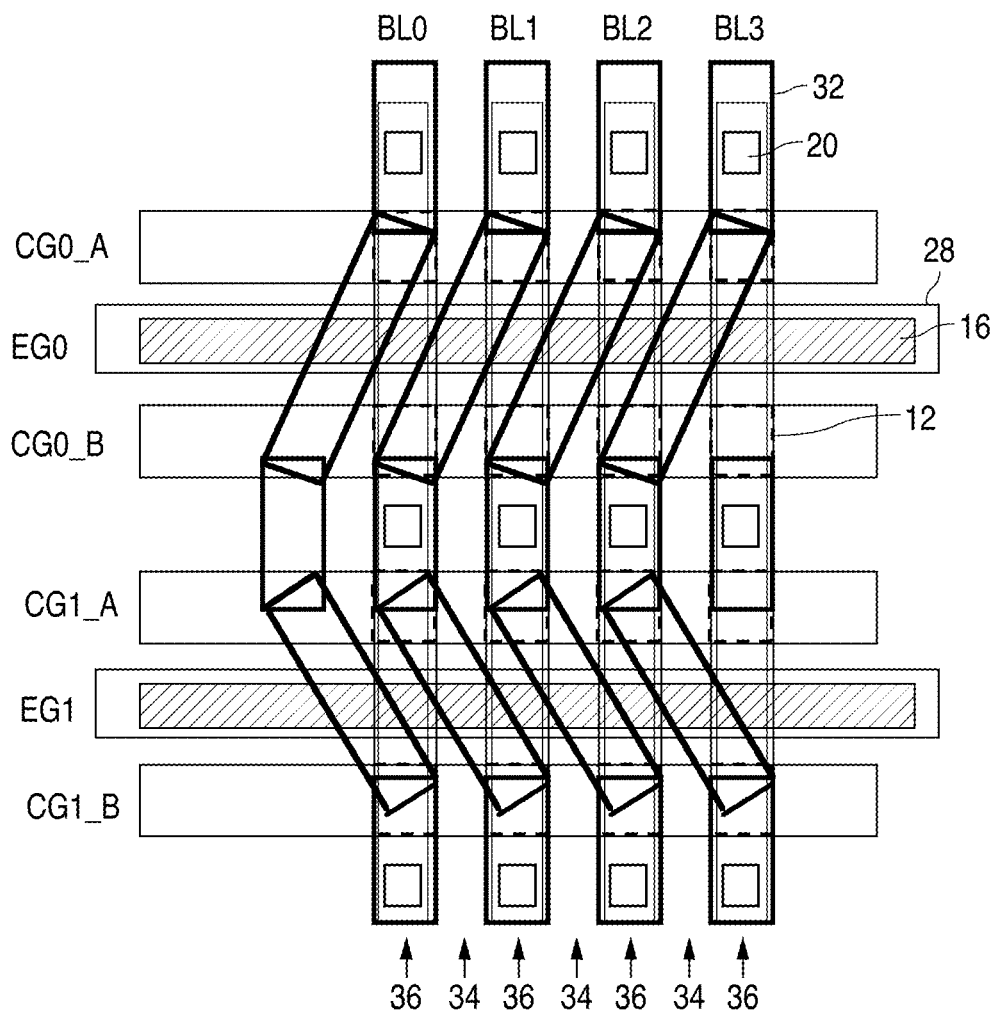
FIG. 11 is a plan view of the memory cell array layout for architecture #2.

FIG. 10 shows a second architecture (#2), and FIG. 11 shows the corresponding layout, which is applicable for Cells #1 and #2. In this configuration, the pairs of memory cells are oriented orthogonally relative to architecture #1 (i.e. with architecture #2, each pair of memory cells sharing a common erase gate 16 (EG) extends in the vertical direction as do the active and isolation regions 36/34, meaning one memory cell of the pair of memory cells sharing an erase gate is above the other in the column). This also means the control gate lines 14 (CGB, CG1, etc.) run horizontally instead of vertically. The bit lines 32 (BL) remain running generally vertically (along the length of the columns). However, purely vertical bit lines 32 (BL) are not compatible with the virtual ground memory cell configuration because of the need to independently operate (i.e. at different voltages) the two drain regions 18 for each memory cell pair. Therefore, the bit lines 32 (BL0, BL1, BL2, etc.) (i.e., conductive lines such as metal connected to the individual drain regions by contacts 20), are in a zigzag configuration, where they connect to two adjacent columns of the memory cells in an alternating fashion. Specifically, for any given memory cell pair sharing a common erase gate 16, two different bit lines 32 connect to the two drain regions 18 respectively. As shown in FIGS. 10 and 11, each bit line 32 connects to the drain 18 of one of the memory cell pair, then moves over laterally and connects to the other drain region 18 but in a different column, and then the reverse for the next pair of memory cells, and so on. Therefore, the two drain regions 18 for each pair of memory cells (sharing a common erase gate 16) are connected to two different bit lines 32. Preferably the erase gates 16 for each row of memory cells are a continuous polysilicon stripe strapped to a horizontal metal line 28. Similarly, the control gates 14 for each row of memory cells are a continuous horizontal poly, which can also be strapped to a horizontal metal line.

In this embodiment, the pairs of memory cells are configured in an array such that for each of the pairs of memory cells, the channel region extends from the first drain region DRA to the second drain region DRB in the same direction (vertically down in FIG. 11). Additionally, in each active region, the pairs of memory cells are configured end to end such that the first region of one memory cell pair is contiguously formed with (electrically connected to) the second region of an adjacent memory cell pair in the same active region, and the second region of the one memory cell pair is continuously formed with (electrically connected to) the first region of the other adjacent memory cell pair in the same active region.

FIG. 12 includes a table of operating voltages (including non-limiting examples of actual voltages) for programming and reading a selected memory cell (in this case memory cell M2, which corresponds to EG0, BL1 and CG0_A) for architecture #2. The erase voltage (VEGE on the selected EG line) indicated in this figure will erase all the memory cells in the pair of rows containing the selected memory cell M2. FIG. 13 includes a second table of operating voltages which is the same as in FIG. 12, except a lower erase voltage VEGE is used, and a negative voltage VCGE is applied to the control gates during erase. In a read operation, selected BL, EG and CG lines of a selected memory cell pair are biased at selected read bias voltages, the other CG of selected memory cell pair is biased at a pass read bias voltage, while other unselected CGs are biased at 0 Volts, and other BL lines are biased at 0 Volts. In a program operation, selected BL, EG and CG lines of the selected memory cell pair are biased at selected program bias voltages, the other BL line of the selected memory cell pair is biased at a program current, while the other adjacent BL line of unselected memory cell pair sharing the selected BL and CG lines is biased at an inhibit voltage VBLINH, and other unselected BL lines are biased at an inhibit voltage VBLINH (or float or 0 Volt), while the other CG line of selected memory cell pair is biased at a pass program bias voltage and other unselected CGs are biased at 0 volts.

Architecture #3

Figure 14:
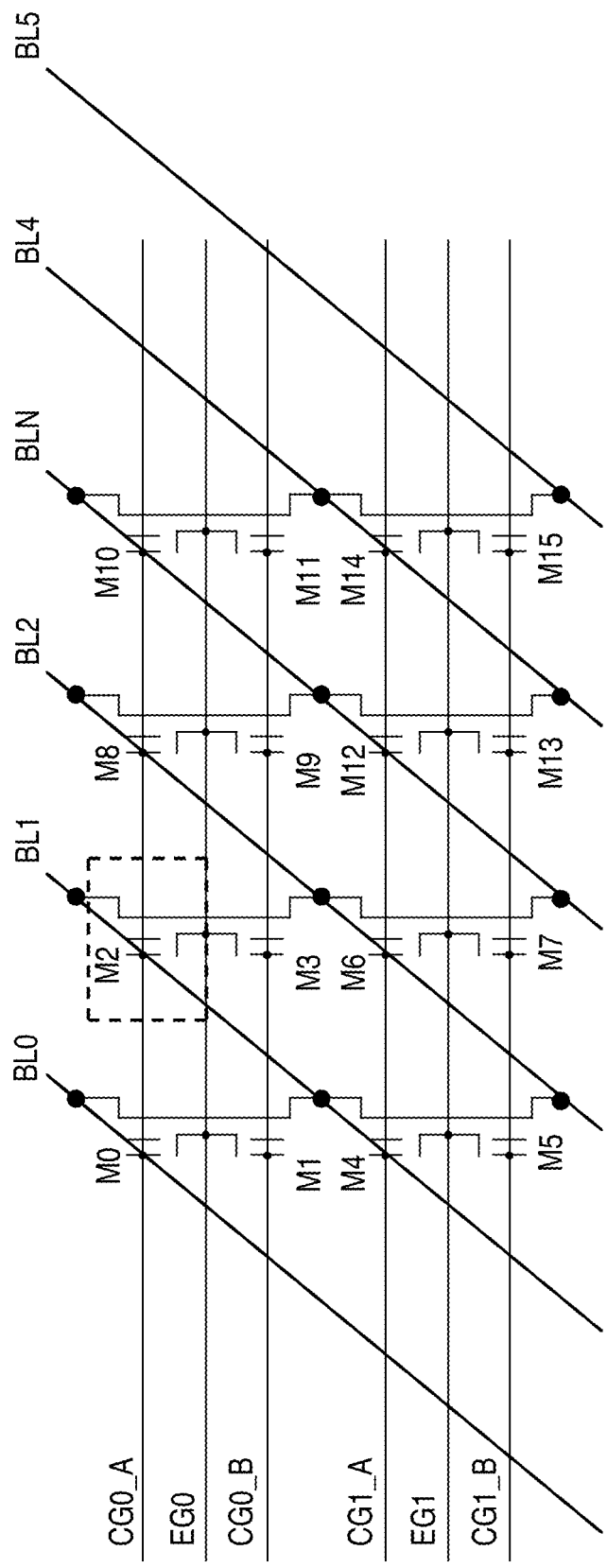
FIG. 14 is a schematic diagram of a third memory cell array architecture (architecture #3), applicable for Cells #1 and #2.
Figure 15:
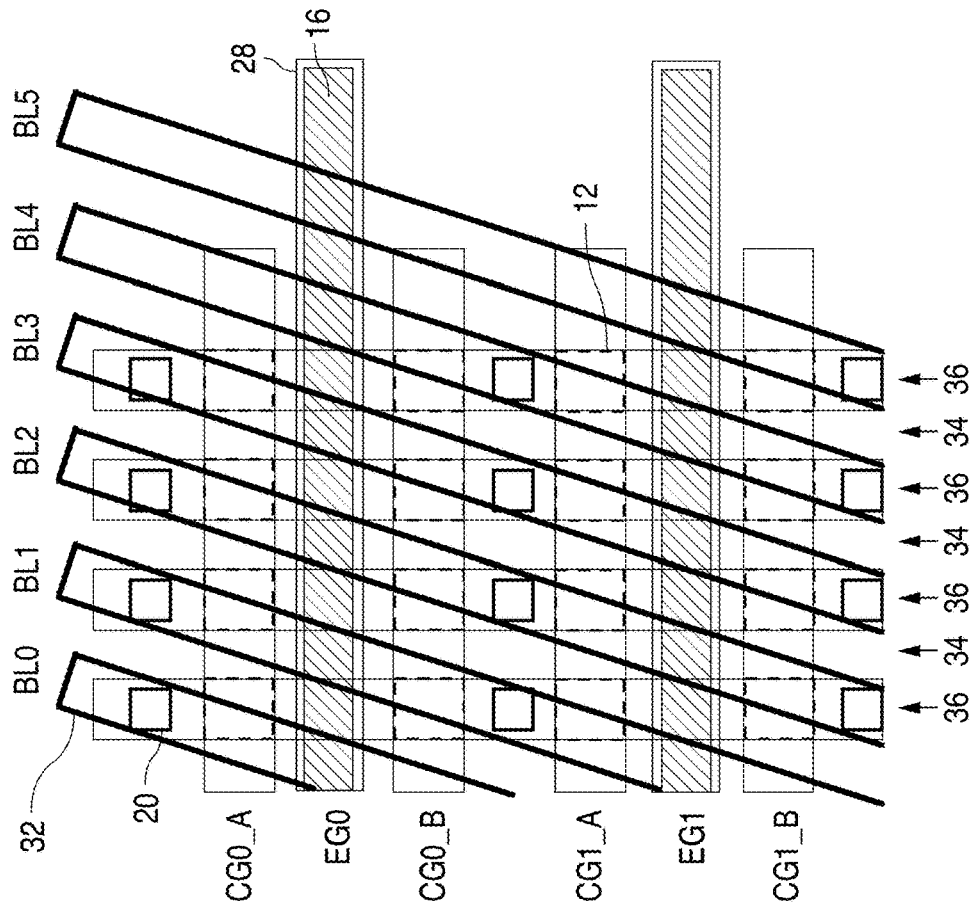
FIG. 15 is a plan view of the memory cell array layout for architecture #3.

FIG. 14 shows a third architecture (#3), and FIG. 15 shows the corresponding layout, which is applicable for Cells #1 and #2. This configuration is similar to that of the second architecture #2, but the bit lines 32 (BL) are arranged in a diagonal configuration (relative to the direction of the active regions) instead of a zigzag configuration, so that each successive drain connection is in an adjacent column. Specifically, each bit line 32 (BL) connects to one drain region 18 (DR) in one column and then connects to the next drain region 18 (DR) but in the next column over, and so on. For example, bit line BL3 connects to left hand drain for memory pair 0 in column 3, and then connects to right hand drain for memory pair 0 but in column 2, and then connects to the left hand drain for memory pair 1 in column 1, and so on. Therefore, the two drain regions 18 for each pair of memory cells (sharing a common erase gate 16) are connected to two different bit lines 32. Preferably the erase gates 16 are a continuous polysilicon stripe strapped to a horizontal metal line 28. Similarly, the control gates are a continuous horizontal poly for each row of memory cells, and can be strapped to a horizontal metal line.

Figure 16:
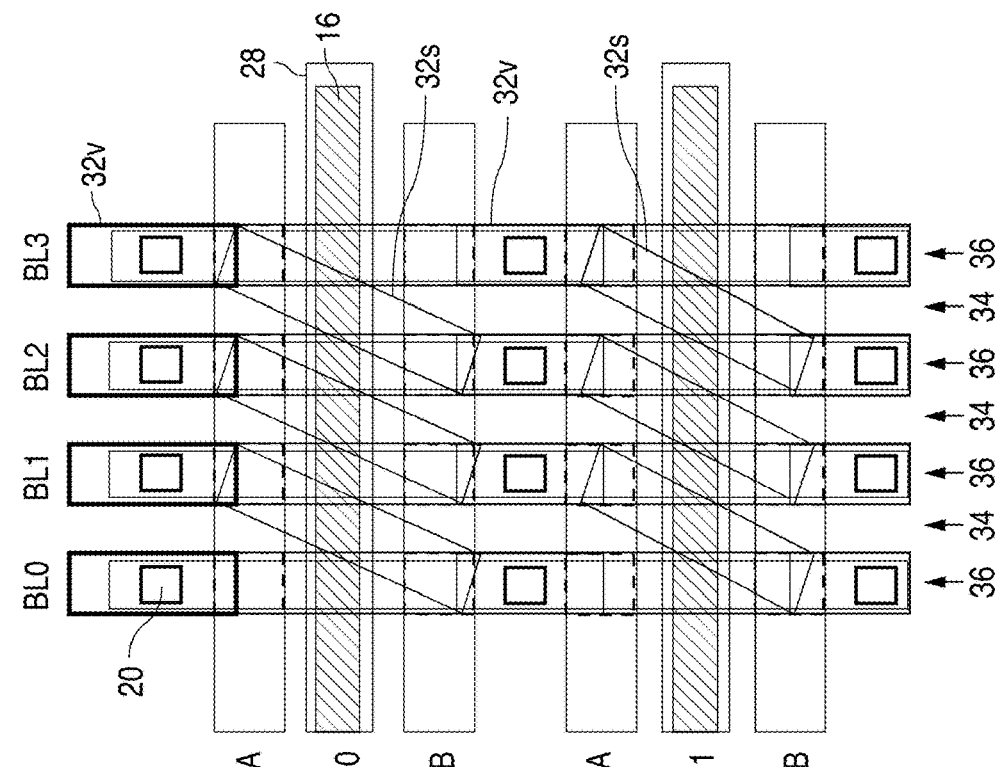
FIG. 16 is a plan view of a first alternate memory cell array layout for architecture #3.

FIG. 16 below shows an alternate layout for architecture #3. This layout is the same as that in FIG. 16, except that instead of the bit lines 32 (BL) having a linear slant, they have vertical portions 32v over the contacts (extending in the column direction), and slant portions 32s (extending at a non-zero angle relative to the column direction) making the connection with the next adjacent column.

FIG. 17 includes a table of operating voltages (including non-limiting examples of actual voltages) for programing and reading a selected memory cell (in this case memory cell M2, which corresponds to EG0, BL1 and CG0_A) for architecture #3. The erase voltage (VEGE on the selected EG line) indicated in this figure will erase all the memory cells in the pair of rows containing the selected memory cell M2. FIG. 18 includes a second table of operating voltages which is the same as in FIG. 17, except a lower erase voltage VEGE is used, and a negative voltage VCGE is applied to the control gates during erase. In a read operation, selected BL, EG and CG lines of a selected memory cell pair are biased at selected read bias voltages, the other CG line of selected memory cell pair is biased at a pass read bias voltage, other unselected CGs are biased at 0 Volts, and other BL lines are biased at 0 Volts. In a program operation, selected BL, EG and CG lines of the selected memory cell pair are biased at a selected program bias voltages, the other BL line of the selected memory cell pair is biased at a program current, other adjacent BL line of unselected memory cell pairs sharing the selected BL and CG lines is biased at an inhibit voltage VBLINH, other unselected BLs are biased at an inhibit voltage VBLINH (or float or 0 Volt), the other CG of selected memory cell pair is biased at a pass program bias voltage, and other unselected CGs are biased at 0 volt.

Architecture #4

Figure 19:
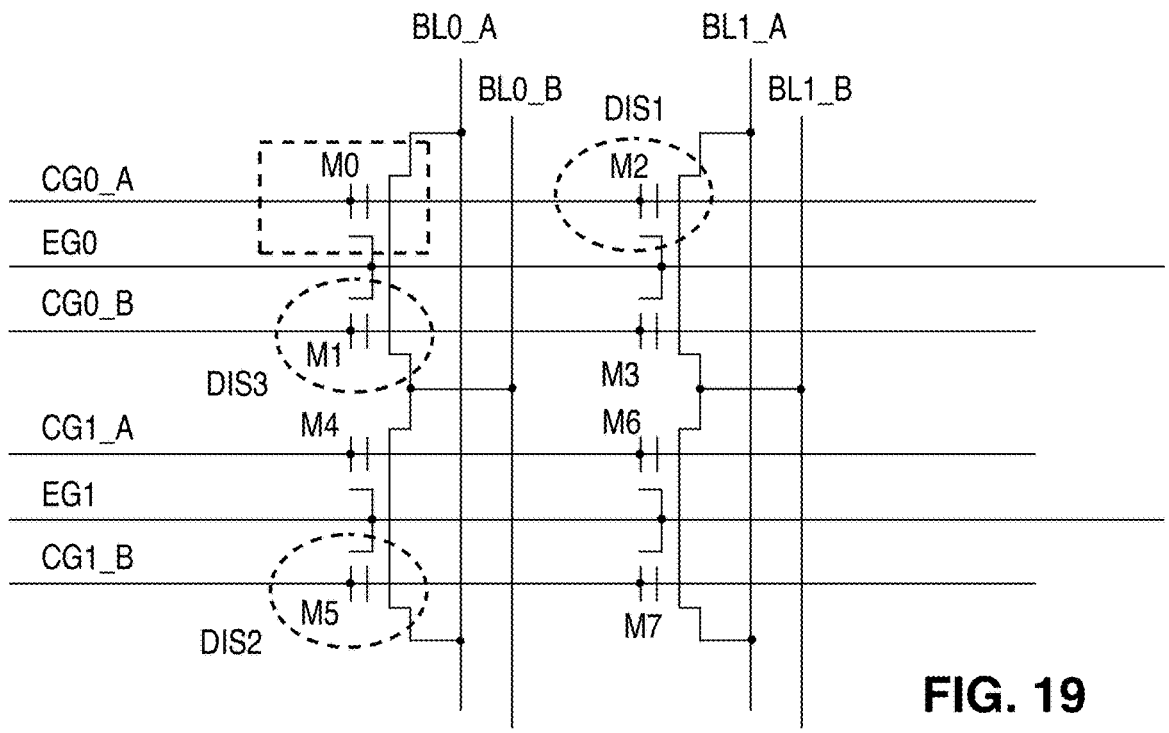
FIG. 19 is a schematic diagram of a fourth memory cell array architecture (architecture #4), applicable for Cells #1 and #2.
Figure 20:
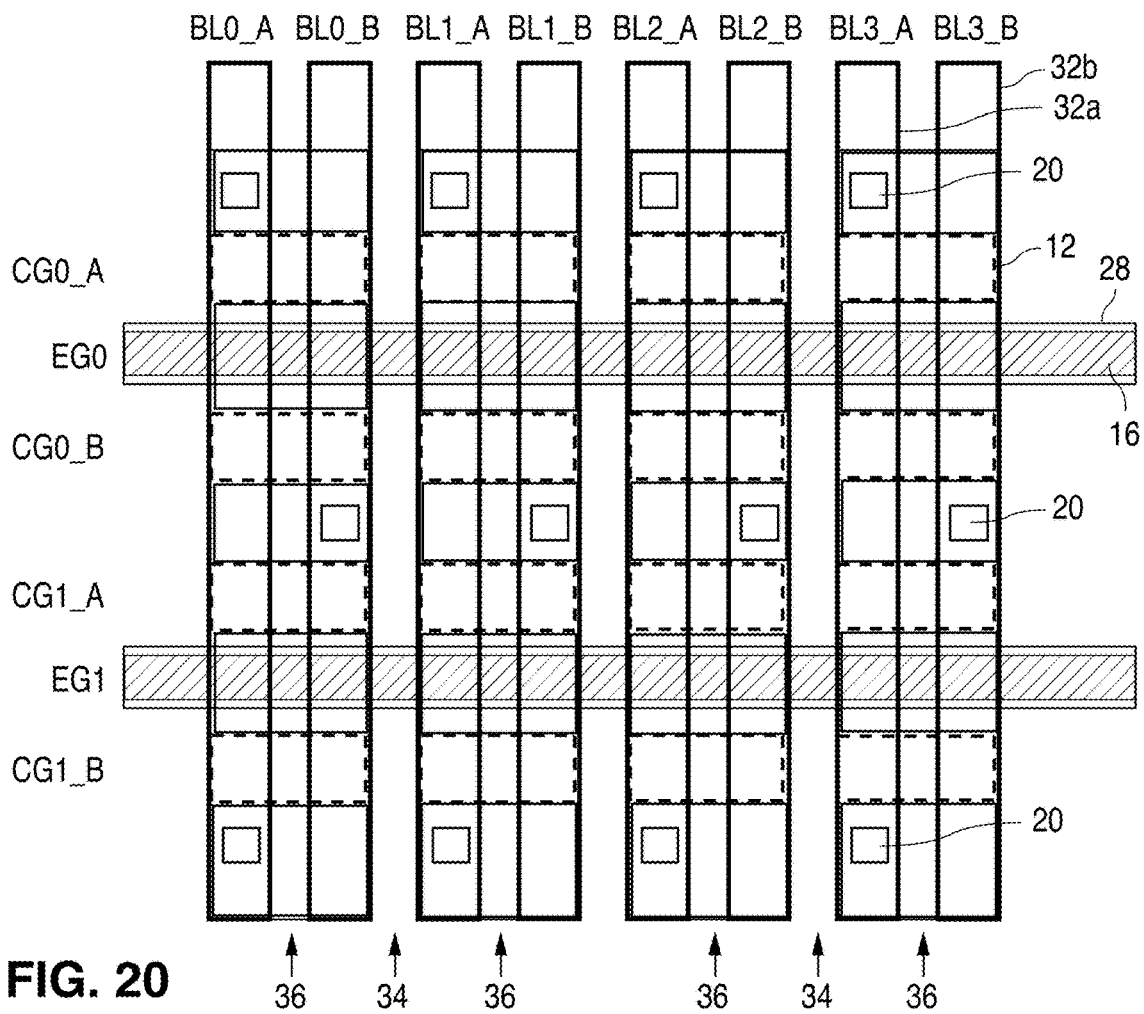
FIG. 20 is a plan view of the memory cell array layout for architecture #4.

FIG. 19 shows a fourth architecture (#4), and FIG. 20 shows the corresponding layout, which is applicable for Cells #1 and #2. This configuration is similar to that of the second and third architectures #2 and #3, but instead of bit lines 32 (BL) arranged with a zigzag, linear diagonal, or vertical with slanted segments (to avoid both drain regions for each pair of memory cells sharing a common erase gate being connected to the same bit line), there are two vertical bit lines 32a and 32b for each column of memory cells, where the contacts 20 from the bit lines 32a and 32b down to the drain regions 18 are staggered. Specifically, for column 3, the first bit line 32a (BL3_A) is connected via contacts 20 to just the right hand drain 18 for each memory pair, and the second bit line 32b (BL3_B) is connected via contacts 20 to just the left hand drain 18 for each memory pair. The drain regions 20 are wide enough in the horizontal direction so that both bit lines 32a and 32b pass vertically over each drain region 18. Therefore, the two drain regions 18 for each pair of memory cells (sharing a common erase gate 16) are connected to two different bit lines 32a/32b.

FIG. 21 includes a table of operating voltages (including non-limiting examples of actual voltages) for programing and reading a selected memory cell (in this case memory cell MO, which corresponds to EG0, BL0_A, and CG0_A) for architecture #4. The erase voltage (VEGE on selected EG line) indicated in this figure will erase all the memory cells in the pair of rows containing the selected memory cell MO. FIG. 22 includes a second table of operating voltages which is the same as in FIG. 21, except a lower erase voltage VEGE is used, and a negative voltage VCGE is applied to the control gates during erase. In a read operation, selected BL, EG and CG lines of a selected cell pair are biased at selected read bias voltages, the other CG line of selected memory cell pair is biased at a pass read bias voltage, other unselected CG lines are biased at 0 Volts, and other BL lines are biased at 0 Volts. In a program operation, selected BL, EG and CG lines of the selected memory cell pair are biased at selected program bias voltages, the other BL line of the selected memory cell pair is biased at a program current, other unselected BLs are biased at an inhibit voltage VBLINH, the other CG of selected memory cell pair is biased at a pass program bias voltage, and other unselected CGs are biased at 0 volts.

Architecture #5

Figure 23:
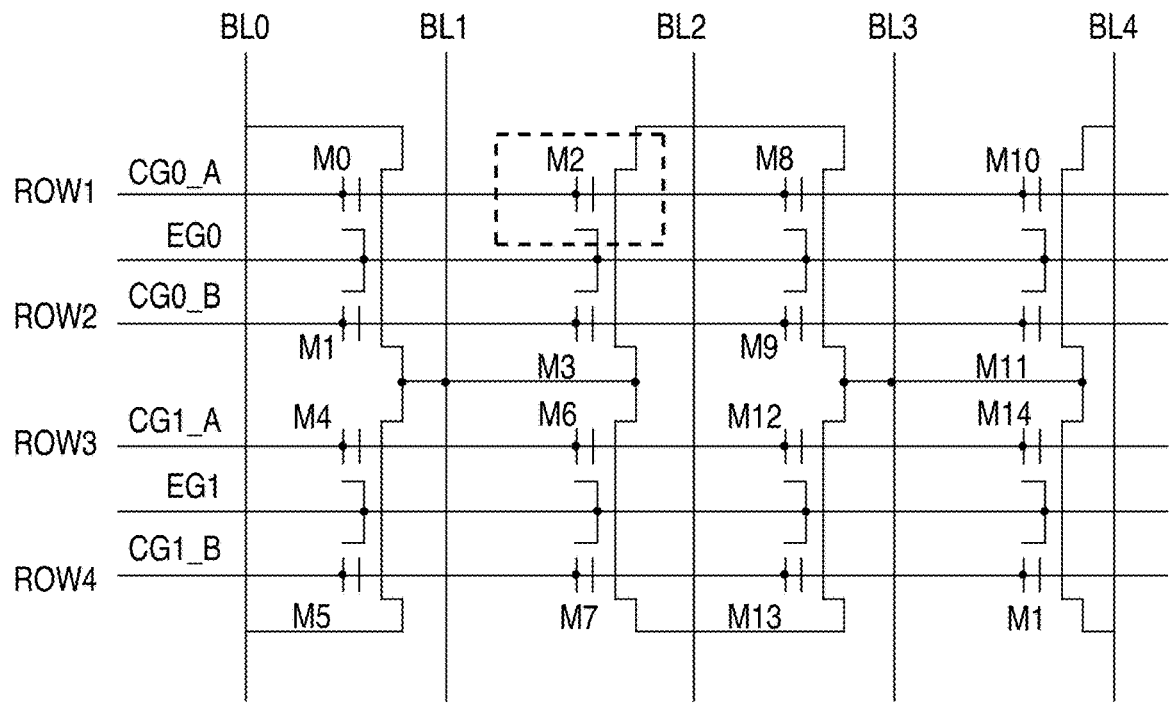
FIG. 23 is a schematic diagram of a fifth memory cell array architecture (architecture #5), applicable for Cell #1.
Figure 24:
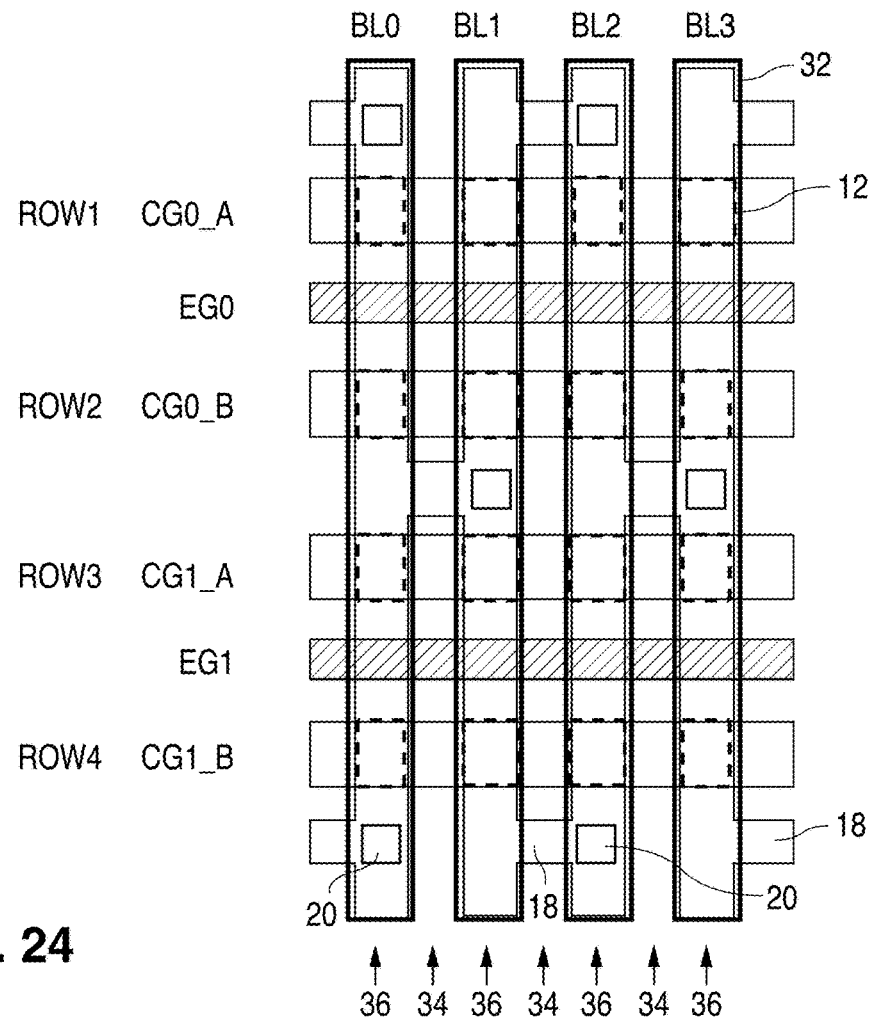
FIG. 24 is a plan view of the memory cell array layout for architecture #5.
Figure 25:
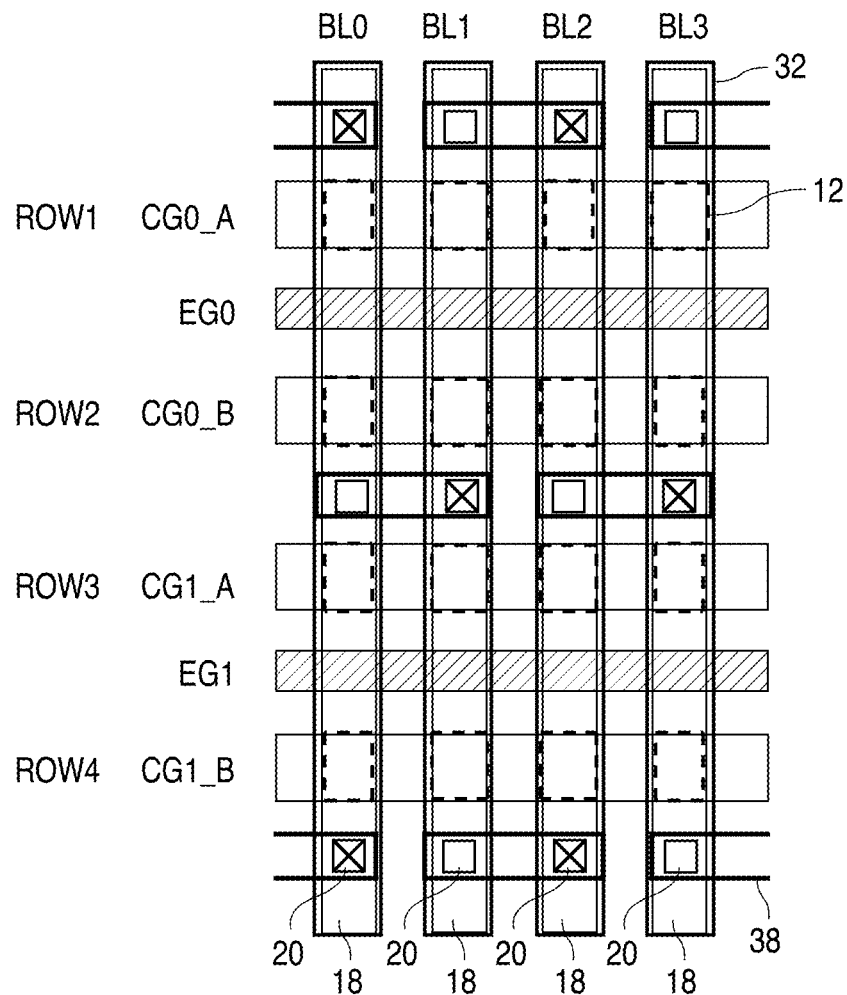
FIG. 25 is a plan view of a first alternate memory cell array layout for architecture #5.

FIG. 23 shows a fifth architecture (#5), and FIGS. 24-25 show the corresponding layouts, which is applicable for Cell #1. In this configuration, instead of the bit lines 32 (BL) arranged with a zigzag, linear diagonal, or vertical with slanted segments, or multiple bit lines per column of memory cells (to avoid both drain regions for each pair of memory cells sharing a common erase gate being connected to the same bit line), there is a single vertical bit line 32 for each column of memory cells, where each bit line 32 is connected only to every other drain region 18 in the column. For example, bit line BL0 is connected to the drain 18 for rows 1, 4-5, 8-9, and so on (given the drain regions 18 are shared between adjacent memory cell pairs). Bit line BL1 is connected to the drain 18 for rows 2-3, 6-7, 10-11, and so on. Any drain 18 having a contact to a bit line 32 is also electrically connected to the drain 18 in one of the adjacent columns. These electrical connections also alternate. For example, in row 1, the drains 18 for columns 1-2, 3-4, 5-6, and so on are connected together. In rows 2-3, the drains 18 for columns 0-1, 2-3, 4-5, and so on are connected together. The connections can be diffusion connections extending through the isolations regions, as shown in FIG. 24. Alternately, metal connectors 38 can make the electrical connections, as shown in FIG. 25. Therefore, the two drain regions 18 for each pair of memory cells (sharing a common erase gate 16) are connected to two different bit lines 32.

FIG. 26 includes a table of operating voltages (including non-limiting examples of actual voltages) for programing and reading a selected memory cell (in this case memory cell M2, which corresponds to EG0, BL2 and CG0_A) for architecture #5. The erase voltage (VEGE on selected EG line) indicated in this figure will erase all the memory cells in the pair of rows containing the selected memory cell M2. FIG. 27 includes a second table of operating voltages which is the same as in FIG. 26, except a lower erase voltage VEGE is used, and a negative voltage VCGE is applied to the control gates during erase. In a read operation, selected BL, EG and CG lines of a selected cell pair are biased at selected read bias voltages, the other CG line of selected memory cell pair is biased at a pass read bias voltage, other unselected CG lines are biased at 0 Volts, and other BL lines are biased at 0 Volts. In a program operation, selected BL, EG and CG lines of the selected memory cell pair are biased at selected program bias voltages, the other BL line of the selected memory cell pair is biased at a program current, other unselected BLs are biased at an inhibit voltage VBLINH (or float or 0 Volts), the other CG of selected memory cell pair is biased at a pass program bias voltage, and other unselected CGs are biased at 0 volt.

Architecture #6

Figure 28:
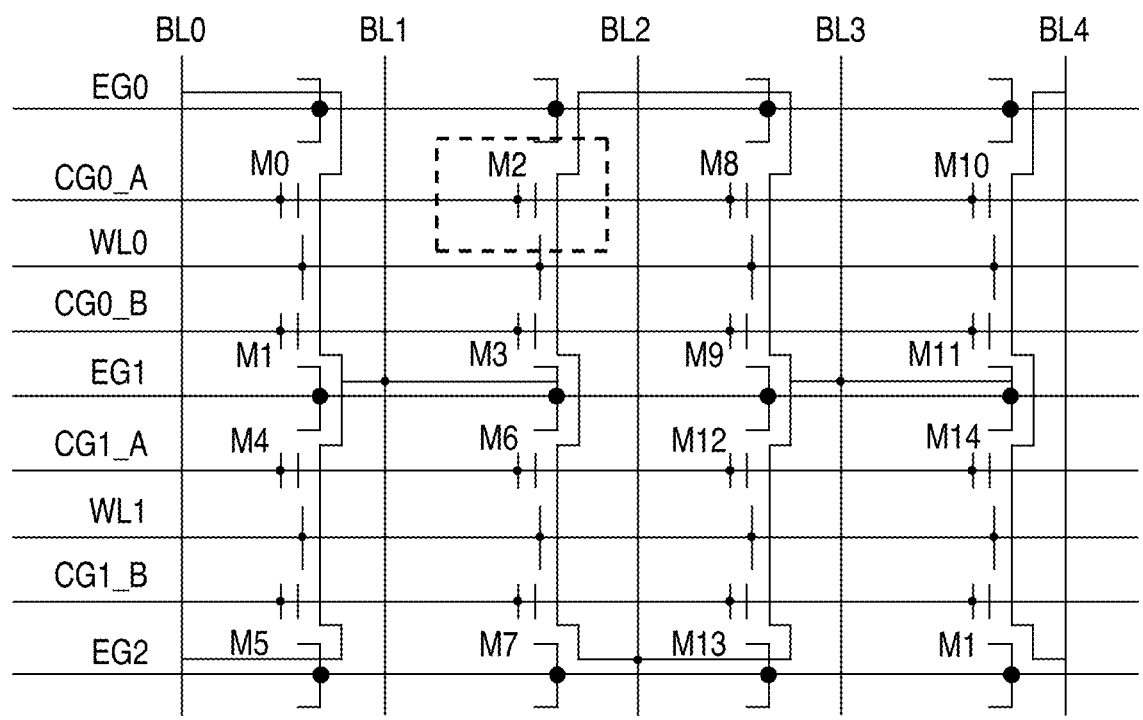
FIG. 28 is a schematic diagram of a sixth memory cell array architecture (architecture #6), applicable for Cell #3.
Figure 29:
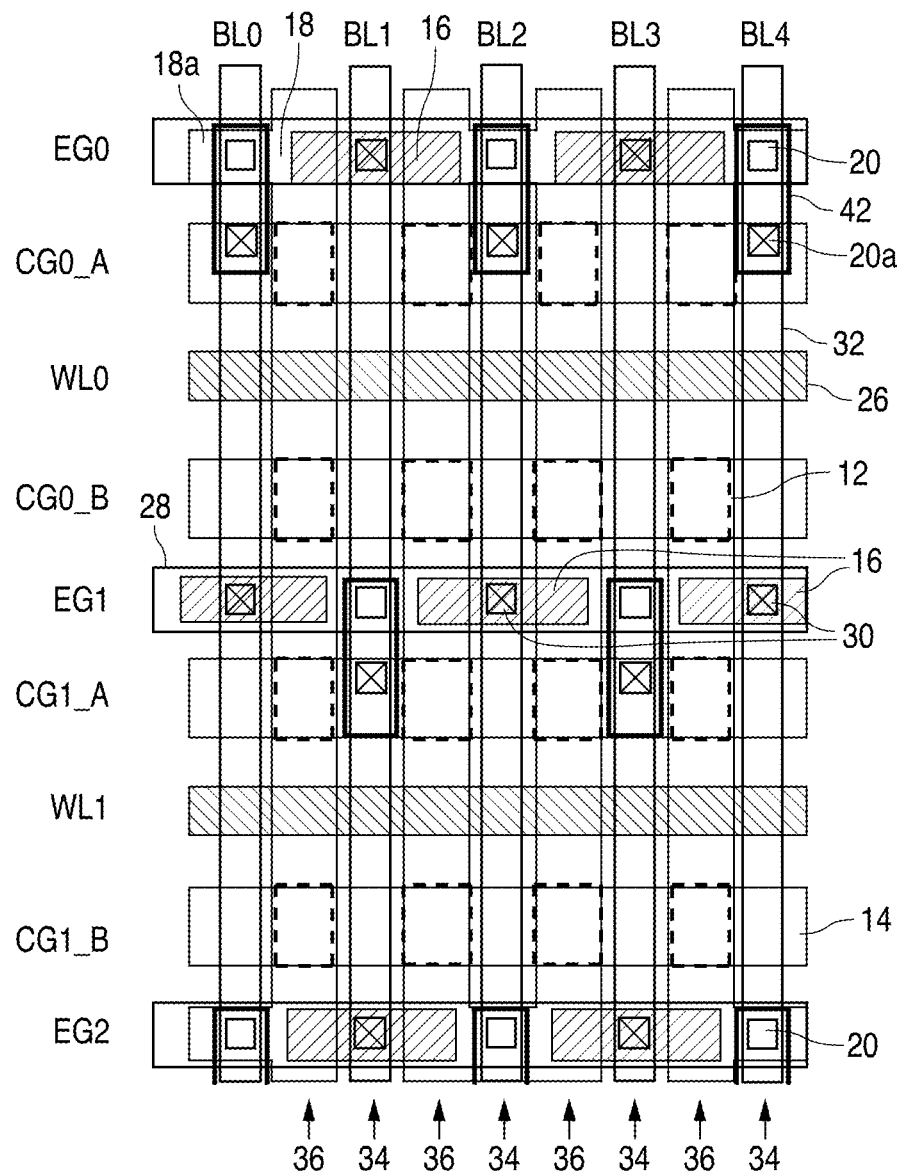
FIG. 29 is a plan view of the memory cell array layout for architecture #6.

FIG. 28 shows a sixth architecture (#6), and FIG. 29 shows the corresponding layout, which is applicable for Cell #3. In this configuration, the pairs of memory cells, formed in the active regions 36, extend vertically. The polysilicon word lines 26 (WL) and control gate poly lines 14 (CG) extend horizontally. Pairs of erase gates 16 (EG) are formed as poly lines that extend horizontally across the isolation region 34 between two adjacent active regions 36 (i.e. pairs of EG gates 16 in the same row but different columns are formed by a single stripe of poly). An EG contact 30 connects each EG poly to a metal EG line 28 that extends over and connects to all EG polys in the same row. As with the previous architecture, there is a single vertical bit line 32 for each column of memory cells, where each bit line 32 is connected only to every other drain region 18 in the column by contacts 20. Similarly, there are diffusion connections 18a between alternating drain regions 18 of adjacent columns extending through the isolations regions 34. The drain 18 contacts to each diffusion connection are formed in the isolations regions 34, along with a metal bridge 42 connected thereto that extends downwardly to over one of the control gate lines, which is where a bit line contact 20a is formed that connects to a metal bit line 32 for that pair of columns. Each metal bit line 32 extends vertically over the isolation region 34 between the two columns of memory cells to which it connects. Therefore, the two drain regions 18 for each pair of memory cells (sharing a common erase gate) are connected to two different bit lines 32.

FIG. 30 includes a table of operating voltages (including non-limiting examples of actual voltages) for programing and reading a selected memory cell (in this case memory cell M2, which corresponds to EG0, BL2, WL0 and CG0_A) for architecture #6. The erase voltage (VEGE on selected EG line) indicated in this figure will erase all the memory cells in the pair of rows containing the selected memory cell M2. FIG. 31 includes a second table of operating voltages which is the same as in FIG. 30, except a lower erase voltage VEGE is used, and a negative voltage VCGE is applied to the control gates during erase. In a read operation, selected BL, WL, EG and CG lines of a selected cell pair are biased at selected read bias voltages, the other CG line of selected memory cell pair is biased at a pass read bias voltage, other unselected CG lines are biased at 0 Volts, other BL lines are biased at 0 Volts, and other unselected WL lines are biased at 0 Volts. In a program operation, selected BL, WL, EG and CG lines of the selected memory cell pair are biased at selected program bias voltages, the other BL line of the selected memory cell pair is biased at a program current, other unselected BLs are biased at an inhibit voltage VBLINH (or float or 0 Volt), the other CG of selected memory cell pair is biased at a pass program bias voltage, other unselected CGs are biased at an inhibit voltage VCGINH or 0 volts, and other unselected WL lines are biased at 0 Volts.

Figure 32:
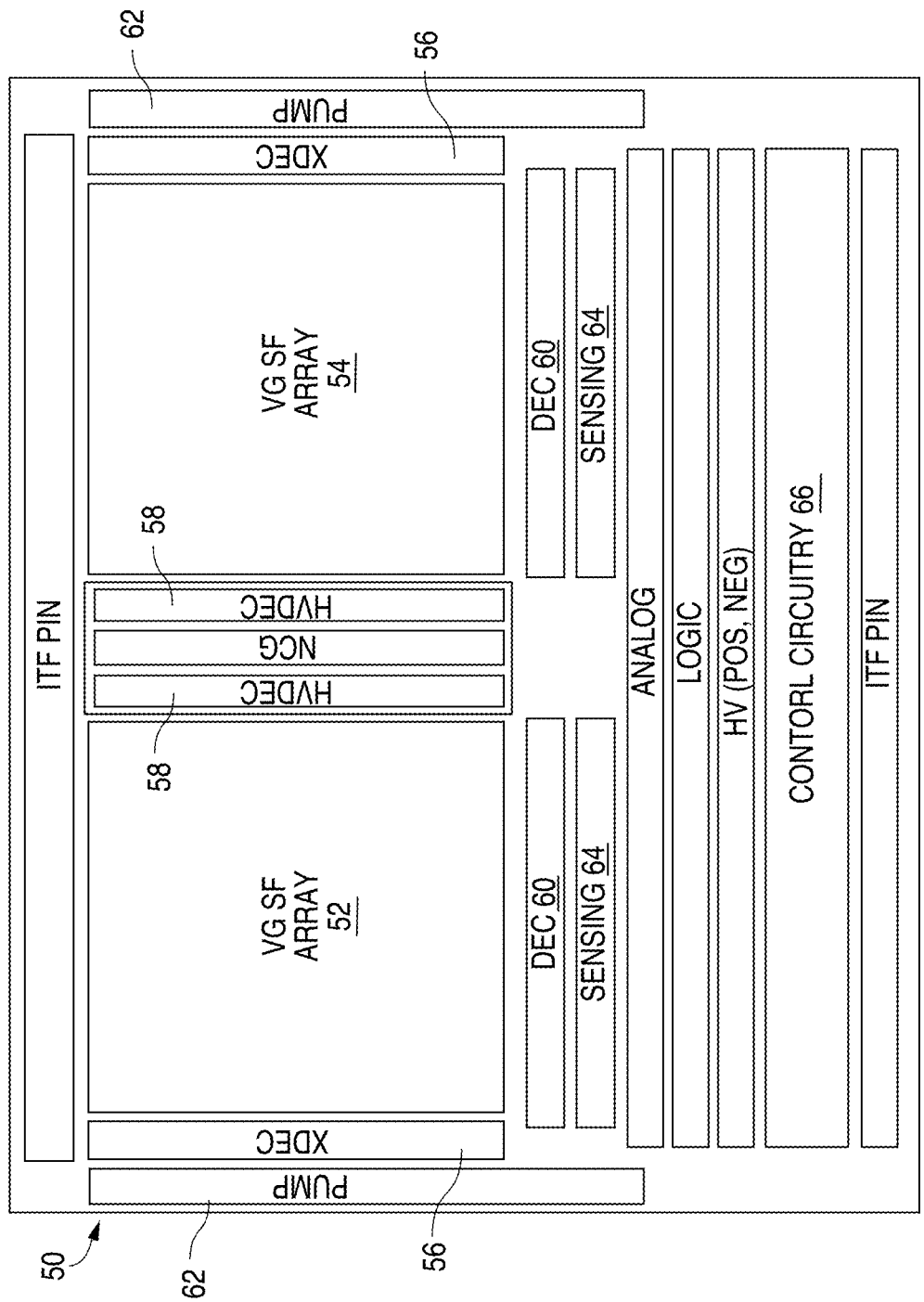
FIG. 32 is a plan view of the components of the memory cell device for all architectures.

The components of memory device 50 according to any of the above six described architectures is illustrated in FIG. 32. The memory device 50 includes two separate arrays 52 and 54 of non-volatile memory cells according to any of the embodiments described above, formed on a single chip. Adjacent to the arrays 52 and 54 of non-volatile memory cells are address decoders 56, 58 and 60 used to decode addresses and supply the various voltages to the above described lines during read, program, and erase operations for selected memory cells. Charge pumps 62 supply voltages during operation. Sense amplifiers 64 are used to read memory cell channel currents during read operations to determine the state of the selected memory cell. Control circuitry 66 is configured to control the components of the memory device 50 to provide the various voltages and currents on the various lines described above during the read, program and erase operations.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell array of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device comprising:
   a substrate of semiconductor material of a first conductivity type;
   spaced apart isolation regions formed on the substrate which are substantially parallel to one another and have lengths that extend in a first direction, with an active region between each pair of adjacent isolation regions, wherein each of the active regions has a length extending in the first direction;

each of the active regions including a plurality of pairs of memory cells, each of the memory cell pairs includes:
- first and second regions spaced apart in the substrate and having a second conductivity type different than the first conductivity type, with a continuous channel region in the substrate extending entirely between the first and second regions,
- a first floating gate disposed vertically over and insulated from a first portion of the channel region adjacent to the first region,
- a second floating gate disposed vertically over and insulated from a second portion of the channel region adjacent to the second region,
- an erase gate disposed vertically over and insulated from a third portion of the channel region between the first and second channel region portions,
- a first control gate disposed vertically over and insulated from the first floating gate, and
- a second control gate disposed vertically over and insulated from the second floating gate;

wherein the pairs of memory cells are configured in an array such that for each of the pairs of memory cells, the channel region extends entirely from the first region to the second region in the first direction, the first region is electrically connected to the second region of an adjacent pair of memory cells in the same active region, and the second region is electrically connected to the first region of an adjacent pair of the memory cells in the same active region;

a plurality of first control gate lines having lengths extending in a second direction orthogonal to the first direction and each electrically connected to one of the first control gates in each of the active regions;

a plurality of second control gate lines having lengths extending in the second direction and each electrically connected to one of the second control gates in each of the active regions;

a plurality of bit lines having lengths extending in the second direction and each electrically connected to one of the first regions and one of the second regions in each of the active regions;

a plurality of erase gate lines having lengths extending in the first direction and each electrically connected to the erase gates in one of the active regions.

2. The memory device of claim 1, further comprising:
control circuitry configured to, during a read operation for a selected one of the memory cells, apply:
- a positive voltage to the bit line electrically connected to the selected memory cell;
- a positive voltage to the erase gate line electrically connected to the erase gate of the selected memory cell;
- a positive voltage to the control gate line electrically connected to the control gate of the selected memory cell;
- a positive voltage to the control gate line electrically connected to the control gate of the memory cell paired with the selected memory cell;
- a zero voltage to the control gate lines electrically connected to the control gates of the pairs of memory cells not containing the selected memory cell; and
- a zero voltage to the bit lines electrically connected to the memory cells that are not the selected memory cell.

3. The memory device of claim 1, further comprising:
control circuitry configured to, during a program operation for a selected one of the memory cells, apply:
- a positive voltage to the bit line electrically connected to the selected memory cell;
- a positive voltage to the erase gate line electrically connected to the erase gate of the selected memory cell;
- a positive voltage to the control gate line electrically connected to the control gate of the selected memory cell;
- an electrical current to the bit line electrically connected to the memory cell paired with the selected memory cell; and
- a positive voltage to the control gate line electrically connected to the control gate of the memory cell paired with the selected memory cell.

4. The memory device of claim 3, wherein the control circuitry is configured further to apply:
- a negative voltage to the control gate lines electrically connected to the control gates of a memory cell pair adjacent to the memory cell pair containing the selected memory cell; and
- a zero voltage to the control gate lines electrically connected to the control gates of pairs of the memory cells not containing the selected memory cell and not adjacent to the pair of memory cells containing the selected memory cell.

5. The memory device of claim 1, further comprising:
control circuitry configured to, during an erase operation for a selected one of the memory cells, apply:
- a positive voltage to the erase gate line electrically connected to the erase gate of the selected memory cell; and
- a negative voltage to the control gate line electrically connected to the control gate of the selected memory cell.

* * * * *